United States Patent [19]

Bruel et al.

[11] Patent Number: 4,508,056
[45] Date of Patent: Apr. 2, 1985

[54] TARGET HOLDER WITH MECHANICAL SCANNING

[75] Inventors: Michel Bruel, Veurey; Jean Escaron, Sassenage; Joseph Labartino, Voreppe, all of France

[73] Assignee: Commissariat a l'Energie Atomique, Paris, France

[21] Appl. No.: 504,875

[22] Filed: Jun. 16, 1983

[30] Foreign Application Priority Data

Jun. 24, 1982 [FR] France .................... 82 11077

[51] Int. Cl.³ .......................................... H01L 21/265
[52] U.S. Cl. ....................................... 118/730; 118/729; 118/723; 118/500; 250/492.2; 250/442.1
[58] Field of Search .................... 250/442.1, 492.2; 118/729, 730, 500, 319, 723

[56] References Cited

U.S. PATENT DOCUMENTS

| | | | |
|---|---|---|---|
| 2,821,158 | 1/1958 | Brown et al. | 118/500 X |
| 3,858,547 | 1/1975 | Bergfelt | 118/730 |
| 3,993,909 | 11/1976 | Drews et al. | 250/442.1 X |
| 4,274,004 | 6/1981 | Kanai | 250/442.1 X |

FOREIGN PATENT DOCUMENTS

| | | |
|---|---|---|
| 3114466 | 3/1982 | Fed. Rep. of Germany . |
| 2298880 | 8/1976 | France . |
| 101327 | 6/1982 | Japan . |

OTHER PUBLICATIONS

Christensen, "Method & Apparatus for Depositing Resists", *IBM Tech. Disclosure Bulletin,* vol. 20, No. 10, Mar. 1978, pp. 3913-3914.

Primary Examiner—John D. Smith
Assistant Examiner—Bernard F. Plantz
Attorney, Agent, or Firm—Oblon, Fisher, Spivak, McClelland & Maier

[57] ABSTRACT

Target holder with mechanical scanning. The device comprises several target supports mounted on a plate, which rotates about an axis and means for displacing the supports relative to the plate, arranged in such a way that the radial displacement increment of a support between two consecutive passages in front of the beam is constant throughout the duration of a sweep between two end positions of the support.

Application to ion implantation on a silicon wafer.

13 Claims, 3 Drawing Figures

TARGET HOLDER WITH MECHANICAL SCANNING

BACKGROUND OF THE INVENTION

The present invention relates to a target holder with mechanical scanning or sweeping permitting a homogeneous implantation or a deposition on one or more targets mounted on the device, said deposition or implantation being obtained with the aid of an energy source.

Numerous applications require targets to be struck by a high energy beam or a particle flux, e.g. ion implantation on a silicon wafer used in the production of integrated circuits. Due to the fact that the beam diameter is generally much smaller than the dimensions of the target, the main problem which arises in this type of application is that of the homogeneity of the implantation.

The various systems used hitherto can be placed in two main categories, namely mechanical systems and electrical systems. In the case of mechanical systems, the targets are mounted on a support, which moves in front of a fixed beam. The support is displaced in two crossed movements, namely a slow movement and a fast movement, which is perpendicular to the slow movement. In the prior art, for the performance of the fast movement, the targets can, for example, be placed on a drum rotating about an axis perpendicular to the beam or can be mounted on a deformable support driven by two driving wheels. There is also a system in which the targets placed on the drum constantly retain the same orientation, i.e. they remain parallel to themselves and therefore perpendicular to the beam. The slow movement in the preceding cases is an alternate translation movement in a direction parallel to the rotation axis.

The main disadvantage of such devices is that the movements are slow and the risk of implantation inhomogeneity is great, due to the variations of the intensity of the beam due to the reciprocating movements superimposed on the rotary movement. In addition, the movements of the target can be such that the orientation of the latter with respect to the beam is variable and the angle of incidence is not the same at all points of the target. Although such defects are of little importance when the plates are of small size, they become prohibitive when the size thereof increases, because the impact conditions can vary significantly from one point to another.

Another category of devices uses plates on which are mounted the targets, the rotary axis of the plate being parallel to the beam. The fast movement is in this case rotation, whilst the slow movement is performed by a displacement, parallel to itself, of the rotation axis of the plate, in a plane passing through the beam axis. This device has the advantage that the angle of incidence of the beam on the target is constant. However, it has the disadvantage that the radius of the trajectory of the beam on the target is variable. The lines are not parallel and although the rotation speed is constant, the relative linear velocity of the beam and the target is variable and is dependent on the distance between the beam and the rotation axis. This makes it necessary to have negative feedback systems on the slow speed, in order to obtain a good homogeneity on the target.

In electrical systems, the targets are fixed, but scanning is effected by varying the direction of the ion beam. In view of the fact that the deflection angles increase with the size of the plates, this leads to implantation inhomogeneities despite electronic corrections made during the scanning time.

SUMMARY OF THE INVENTION

The object of the invention is to obviate these disadvantages, by proposing a target holder with mechanical scanning, which makes it possible to obtain an excellent homogeneity of implantation on the targets.

Thus, the present invention specifically relates to a target holder of the type comprising several target supports mounted on a plate rotatable with respect to an axis in order that said supports in turn pass in front of a high energy beam, which is fixed with respect to the plate rotation axis. Each support is displaceable relative to the plate, the arrangement of said displacement means being such that the radial displacement increment of a support between two moments corresponding to two consecutive passages of the support in front of the beam is constant throughout the duration of a sweep between the end positions and such that the support always has the same orientation relative to the plate at each passage in front of the beam.

The movement of the supports is a reciprocating movement, preferably in a radial direction. In this case, two different supports are displaced in according with two different radii of the plate and two adjacent supports move in opposite directions. In the present invention, the rotary plate or disk can be replaced by any other mechanical member having a different shape, provided that the arrangement of the displacement means makes it possible to obtain the same result. The invention is characterized by the conditions to be respected on the radial displacement increment of the supports relative to the plate. However, this does not imply that the displacement is only radial and also does not imply conditions on the kinematics of the supports between two consecutive passages in front of the beam. The position and orientation of the supports must respect clearly defined rules, only at the times corresponding to the passage in front of the beam. The only condition to be respected is that the radial displacement increment is constant between two consecutive passages in front of the beam and no special condition is applied regarding the other components of the displacement.

According to a first embodiment of the invention, the means permitting the displacement of each support relative to the plate comprise a radial slot along which the support can slide, a first driving shaft for rotating the plate, and a cable connecting two adjacent supports and passing over at least one pulley fixed to the shaft.

According to another feature of the first embodiment, the means permitting the displacement of each support relative to the plate comprises a drum mounted on the shaft and which is immobilized in rotation, but free in translation relative to the latter, the drum being equipped with a pin which can cooperate with a slot made in an intermediate part which can rotate about the same axis as the shaft, the rotation speeds of the shaft and the member generally being different.

In this case, the drum advantageously has at least two passages for the cable connecting two adjacent supports, one of these two passages being equipped with means making it possible to fix one of the cable strands relative to the drum.

According to a second embodiment of the invention, the means permitting the displacement of each support relative to the plate comprises a radial slot along which the support can slide, a cylindrical rod provided with a helical guidance groove, arranged parallel to the aforementioned slot and having its ends fixed with respect to the plate, the rod being free in rotation, and a connecting member fixed to the support and the rod, said connecting member being immobilized in rotation, but free in translation relative to the rod.

Finally, according to another feature of the second embodiment, the means making it possible to displace each support relative to the plate also comprise an intermediate part equipped with a pinion and able to cooperate with another pinion positioned at one end of the rod.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
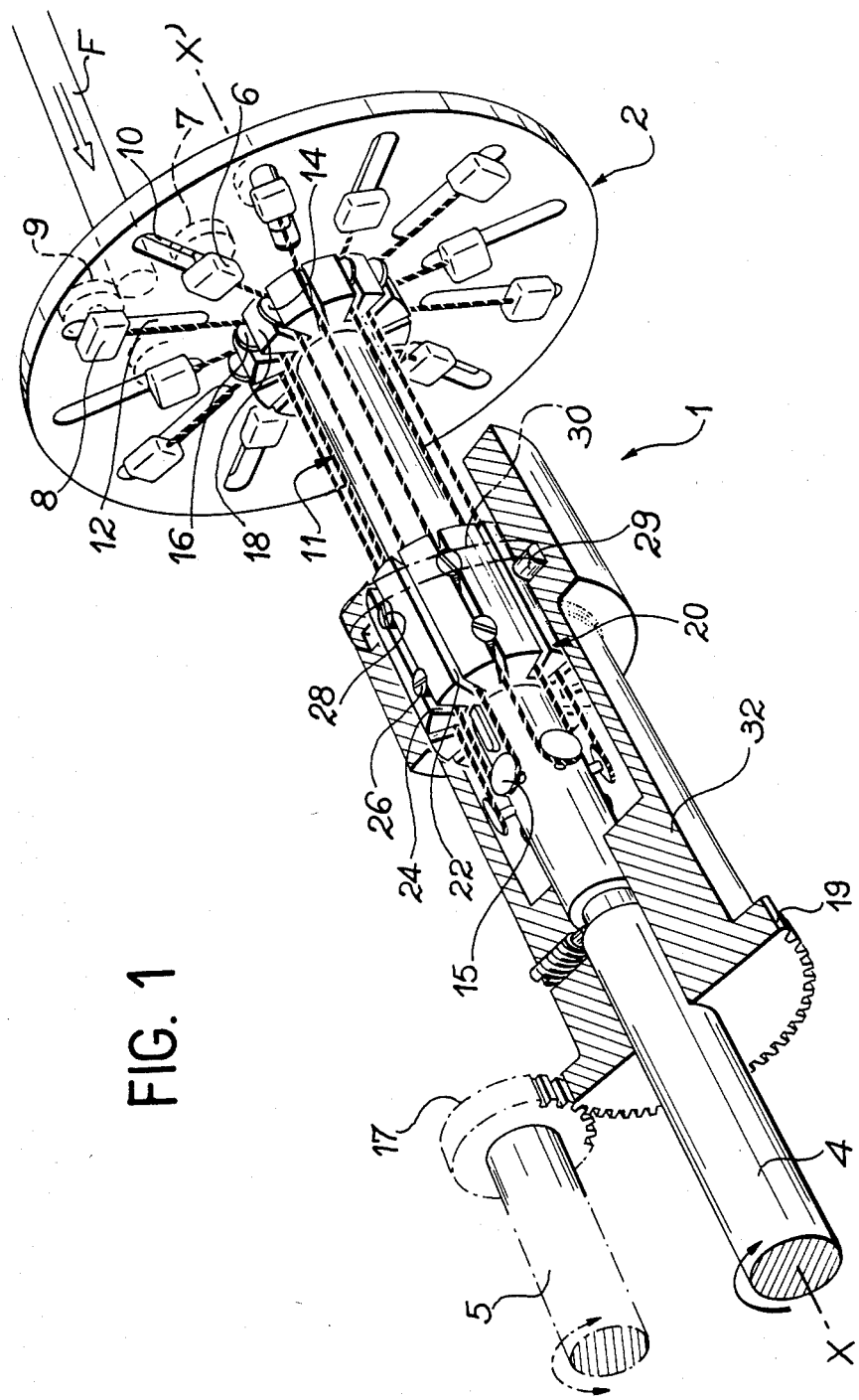
FIG. 1 a diagrammatic perspective and part sectional view of a first embodiment of the target holder according to the invention.

On referring to FIG. 1, it can be seen that the device according to the invention, carrying the general reference 1, essentially comprises a circular plate or disk 2, which rotates about an axis XX' perpendicular to its plane, as a result of a driving shaft 4. A high energy beam F, e.g. an ion beam parallel to axis XX', can strike targets such as 7 and 9, mounted on supports 6 an 8 respectively at a fixed angular position of said plate. To permit the displacement thereof relative to the plate, there are slots 10 and 12, along which supports 6 and 8 can slide. In the embodiment shown here, there are 12 slots arranged in accordance with the radii of the plate, but this number is not imperative and it is possible to provide a random number of supports, but preferably an even number. In can also be seen that the supports 6 and 8 are connected by a cable 11, whereof a first end is fixed to support 6 and whereof the second end is fixed to support 8. Starting from support 6, the cable firstly passes into a pulley 14 mounted on a drum 18, fixed to plate 2. The plane of pulley 14 coincides with that defined by axis XX' and slot 10. The cable then runs parallel to shaft 4, before passing onto a pulley 15, integral with said shaft and returns, whilst still parallel to the latter, up to a further pulley 16 mounted on drum 18, in the same way as pulley 14, whilst its other end is fixed to support 8. FIG. 1 also shows a drum 20, mounted on shaft 4. Drum 20 is integral in rotation with shaft 4, but can move in translation along the latter. Drum 20 has parallel passages, combined in pairs, like the longitudinal passages 22 and 24 for cable 11, which connects supports 6 and 8. Passage 24 is equipped with two screws 26 and 28, whose function is to fix the cable strand corresponding to support 8 to drum 20. In addition, the drum is equipped with a pin 29 able to cooperate with a slot 30, shown diagrammatically in mixed line form, located within an intermediate part 32, shown in sectional form in the drawing. Part 32, which is concentric to shaft 4, is rotated by a second driving shaft 5, which is terminated by a pinion 17, able to engage on another pinion 19 integral with part 32.

Figure 2:
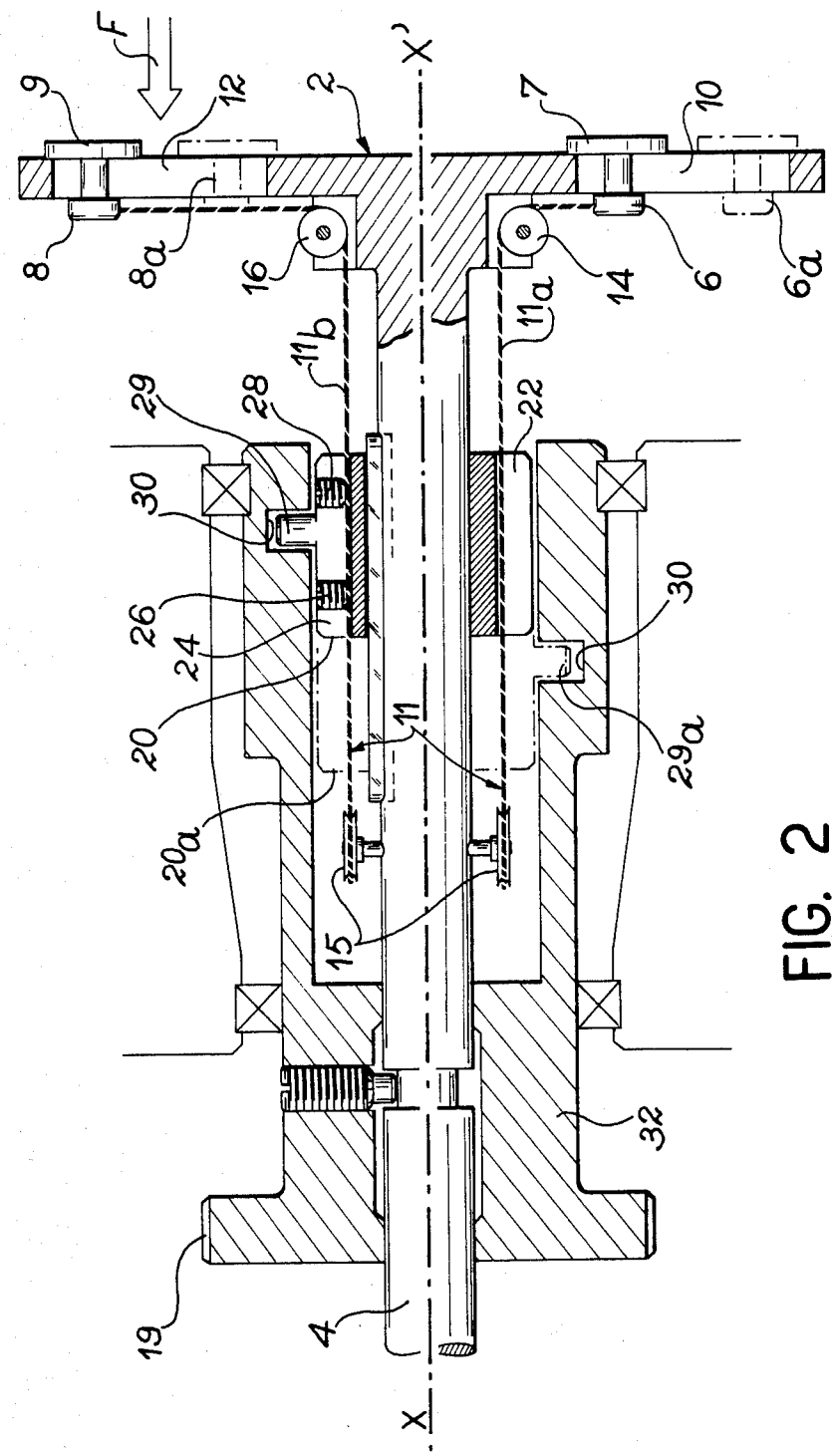
FIG. 2 a diagrammatic cross-sectional view showing the displacement means for the two supports of adjacent targets, turned down on a same plane.

The operation of the device will now be described relative to FIG. 2, which is a sectional view thereof. This is sectioned in two planes, each containing the axis XX', but one passing through the slot 12 of support 8 and the other through slot 10 of support 6, the two views being turned down on a same plane for reasons of clarity. Thus, FIG. 2 shows plate 2 with slots 10 and 12, along which move the supports 6 and 8 respectively. It can also be seen that cable 11 has two strands, whereof the first 11a freely passes in passage 22 of drum 20, whilst the other strand 11b is fixed in passage 24 with the aid of screws 26 and 28.

In view of the fact that shaft 4 and intermediate part 32 rotate about axis XX' at different speeds, the effect of the movement of part 32 is to drive drum 20 longitudinally along shaft 4 via pin 29, which cooperates with slot 30. Thus, the drum can come into a position 20a, diagrammatically shown in mixed lines on the drawing, whilst pin 29 assumes a position 29a. As the cable strand 11b is fixed relative to the drum, the effect of this movement is to move support 8 up to the position 8a, also shown in mixed line form, whilst strand 11a moves in the opposite direction to strand 11b, allowing support 6 to pass into a position 6a on the periphery of the plate. In the embodiment described here, the supports 6 and 8 are constantly displaced towards the outside of the plate by centrifugal force, whilst the latter rotates, but it is also possible to use other means, e.g. springs or any other equivalent system.

Thus, by acting on the rotation speeds of shaft 4 and part 32, as well as on the shape of slot 30, it is possible to obtain all possible combinations between the rotational movement of the plate and the translational movements of the supports along the corresponding slots. For example, a device has been produced in which five rotations of the plate are required to enable a support to perform a single travel between the end points of the corresponding slot. FIG. 2 also shows that the beam F strikes the plate at a point located essentially in the centre of slot 12. Thus, for each passage of slot 12 in front of beam F, a different part of the target 9 placed on support 8 is struck by the beam, because the target holder only moves by a relatively small fraction of the slot length, e.g. one fifth or less between two consecutive passages. It is also possible to introduce a slight sliding action at each point of reversal of the movement of the supports (either towards the centre of the plate, or towards its periphery), in order to introduce another displacement during each passage of the target in front of beam F. This considerably reduces the probability of having the same portion of the target struck twice by beam F. As two adjacent supports, such as 6 and 8 have movements in opposite directions, it is possible to reduce the overall dimensions of the device and to place a maximum number of supports on a plate having given dimensions, but this is not obilgatory.

Figure 3:
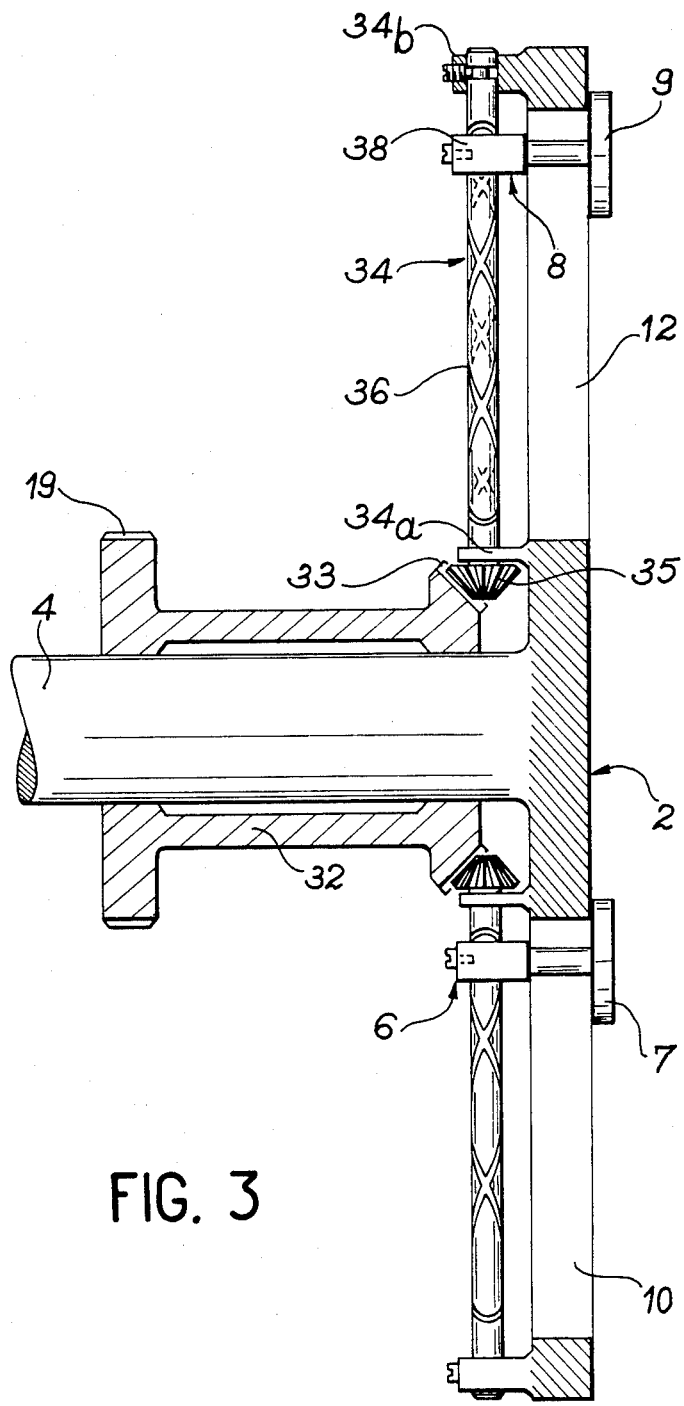
FIG. 3 a diagrammatic cross-sectional view illustrating the second embodiment of the target holder according to the invention.

FIG. 3 illustrates another embodiment, in which the cable system is replaced by a nut-screw system. It can be seen that with each support 8 is associated a rod 34 arranged parallel to slot 12 and whose ends 34a and 34b are fixed to plate 2, respectively towards its centre can its periphery. Rod 34 is consequently immobilized in translation, but free in rotation about its axis. It has a reverse pitch double helical guide 36, which cooperates with a connecting member 38, fixed to support 8. Member 38 can only be displaced in translation parallel to slot 12 and always retains the same orientation with respect to the latter. Thus, the rotational movements of rod 34 lead to a longitudinal displacement of connecting member 38 along rod 34. In the embodiment of FIG. 3, it can be seen that the intermediate part 32 is terminated by a pinion 33, which engages on another pinion 35, located at the end 34a of rod 34. There again, by acting on the rotational speeds of shaft 4 and part 32 and by appropriately choosing the design of the guidance grooves 36 on rod 34, it is possible to combine the rotational movements of plate 2 with translational movements of supports 6 and 8 along slots 10 and 12. Moreover, it is possible to choose the configuration of groove 36 at the ends of rod 34 in such a way as to introduce the displacement at each reversal point of the target holder.

The device according to the invention has particularly interesting advantages, the main one being that it makes it possible to obtain a good homogeneity, because the following characteristics are respected:

- the relative trajectories of the beam and each target have a constant radius, because the distance between beam F and the plate rotation axis is constant, so that scanning takes place at a constant linear velocity, if the rotational speed of the plate is constant;
- the distance between two consecutive trajectories is constant;
- it is also merely necessary for the rotational speed to be constant, or only vary slightly, throughout the duration of a radial sweep, to ensure that the homogeneity condition is respected and due to the displacement introduced at each reversal point none of the beam trajectories on the target exactly covers another.

It is obvious that the invention is not limited to the two embodiments described hereinbefore, but variants thereof can be envisaged without passing beyond the scope of the invention, the aim being to combine the rotational movements of the plate with the translational movements of the target supports along slots. In particular, it is possible to choose a different radial speed of the target supports for each of the two radial displacement directions thereof. Thus, for example, it is possible to have a slow radial movement from the centre towards the periphery, followed by a rapid return. For this purpose, it is merely necessary, in the first embodiment, to give the slot 30 the shape of a double helix with opposite pitches and different values.

A simplification of the system can be provided, if the number of supports is chosen equal to 6+4n, in which n is an integer. Thus, if this condition is respected, it makes it possible to combine two diameterically opposite supports, whilst retaining the fact that two adjacent supports have opposite radial movements. This is an advantage from the dimensioning standpoint and the number of systems to be displaced relative to the plate is divided by two.

What is claimed is:

1. A target holder of the type comprising:
   several target supports mounted on a plate rotatable with respect to an axis in order that said supports in turn pass in front of a high energy beam at a predetermined angular position with respect to the plate rotation axis, and
   means for displacement of each support relative to the plate between two end positions in a direction having a radial component, said displacement means being constructed such that a radial component displacement increment of each said support between any two moments corresponding to any two consecutive passages of said support in front of said predetermined angular position is constant for said movement of said support between said end positions and such that each said support always has the same orientation relative to the plate at each passage in front of said predetermined angular position.

2. A target holder according to claim 1, wherein said displacement means is constructed such that the displacement of the supports relative to the plate is purely radial with respect to said axis.

3. A target holder according to claim 2, wherein said displacement means is constructed such that the radial movement is a reciprocating movement.

4. A target holder according to claim 2, wherein said displacement means is constructed such that each said support is moved along a separate radial displacement direction.

5. A target holder according to claim 3, wherein said displacement means is constructed such that any two adjacent supports have opposite radial movements.

6. A target holder according to claim 5, wherein the number of supports is equal to 6+4n, n being an integer.

7. A target holder according to claim 6, wherein said means for displacement comprises means making possible a combination of two diametrically opposite supports.

8. A target holder according to claim 1, wherein the means for displacement of each support relative to the plate comprise a radial slot along which the support can slide, a first driving shaft for rotating the plate about said axis, and a cable connecting two adjacent supports, said cable passing over at least one pulley fixed to the shaft.

9. A target holder according to claim 8, wherein the means for displacement of each support relative to the plate comprises a drum mounted on the shaft said drum being immobilized in rotation, but free in translation relative to the shaft, the drum having a pin which cooperates with a slot made in an intermediate part which can rotate about said axis, the rotation speeds of the shaft and the member generally being different.

10. A target holder according to claim 9, wherein the drum has at least two passages for a cable connecting two adjacent supports, one of the two passages being provided with means making it possible to fix one of the cable strands relative to the drum.

11. A target holder according to claim 1, wherein the means for displacement of each support relative to the plate comprises a radial slot along which each support can slide, a cylindrical rod provided with a helical guidance groove, arranged parallel to the aforementioned slot and having its ends fixed with respect to the plate, the rod being free in rotation, and a connecting member fixed to each support and connected to the rod, said connecting member being immobilized in rotation, but free in translation relative to the rod.

12. A target holder according to claim 11, wherein the means for displacement also comprise an intermediate part equipped with a pinion cooperable with another pinion positioned at one end of the rod.

13. The target holder of claim 1 wherein said increment is greater than zero.

* * * * *